Dec. 9, 1969 J. W. BENZ, JR 3,483,058
ELECTRICAL LAMINATE AND METHOD OF MAKING SAME
Filed March 23, 1966
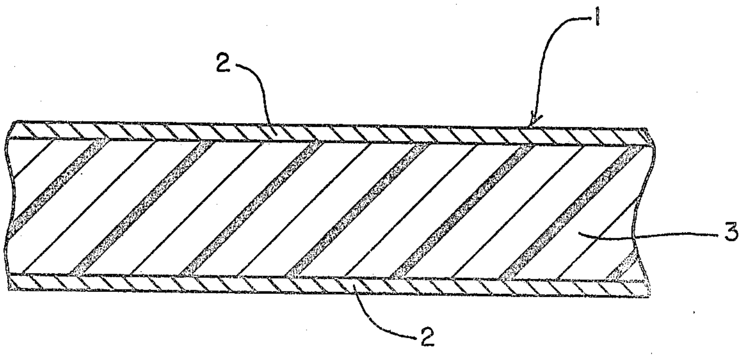
INVENTOR
JOHN W. BENZ JR.
BY Richard O. Church
ATTORNEY

United States Patent Office 3,483,058

Patented Dec. 9, 1969

3,483,058

ELECTRICAL LAMINATE AND METHOD OF MAKING SAME

John W. Benz, Jr., Douglassville, Pa., assignor to The Polymer Corporation, a corporation of Pennsylvania Filed Mar. 23, 1966, Ser. No. 536,817

Int. Cl. B32l *31/12*

U.S. Cl. 156—306 4 Claims

ABSTRACT OF THE DISCLOSURE

A laminate is prepared by bonding copper foil to a polyphenylene oxide base layer by means of heat and pressure after a surface of the copper foil has been oxidized. The laminate is particularly useful for circuit boards or strip transmission lines where high frequencies are encountered and low dielectric losses are desired.

The present invention relates to circuit boards, high frequency strip transmission lines, and the like, and methods and materials useful in their manufacture. More particularly, this invention relates to the use of a new synthetic resin for manufacturing low loss dielectric materials and methods for adhering conductive members onto the surfaces of the low loss dielectric materials so manufactured.

The selection of dielectric materials in the past has been primarily based upon their insulating characteristics. However, with the growing use of circuit boards in the wiring of electronic circuits, other considerations, such as the dielectric loss factor of the circuit board materials, must be considered. This is largely due to the increasing tendency to higher and higher frequencies, to carry higher power inputs, and to miniaturize the circuits.

It can be appreciated that as the imposed power and frequency is increased, the loss of energy to the dielectric material will also increase. These losses, if they become sufficiently high, may result in an erroneous function or failure of the circuit. Even when these extreme conditions are not reached, the accumulated losses, which necessarily must be dissipated in the form of heat, may cause the dielectric material itself to fail mechanically as by softening and melting or by undue thermal expansion. From this it can be appreciated that materials for use in the manufacture of circuit boards and other devices such as high frequency strip transmission lines must be selected with due regard to their dielectric loss factor.

In addition to a low dielectric loss factor, there are certain other requirements for selecting materials of which circuit boards are comprised. For example, it is necessary that this material have high dielectric strength and high surface and volume resistivities. It is also necessary for the dielectric material to have sufficient rigidity to provide the desired mechanical strength and stability that may be required of the circuit board. This is particularly important at higher temperatures which, as previously mentioned, may develop due to the heat lost to the dielectric material. For this reason, it is important not only for the dielectric material to have a high melting point and a high heat distortion temperature, but also to have a relatively low coefficient of thermal expansion so that changing temperatures will not place undue stress upon the various components of the circuits and their surrounding supporting structure.

The heat resistance of the dielectric material is also important with respect to processing operations. For example, it is useful in some applications to dip solder the components to the circuit board after they have been inserted thereon. In order to accomplish this, it is necessary that the dielectric material be capable of withstanding the dip soldering temperatures to which it may be exposed, such as, for example, temperatures of about 450° F. for periods of about 60 seconds.

At the other extreme, circuit boards should not be adversely affected by cold temperatures as may be experienced in circuits carried by aircraft at high altitudes. Accordingly, the low temperature embrittleness point may be an important factor in the selection of a dielectric material.

In addition to these mechanical and electrical properties, the circuit board material should be resistant to chemical attack to protect it from oxidation at elevated temperatures and to provide resistance to certain chemicals, such as common solvents and other chemicals that may be used in cleaning and degreasing the circuitry.

A final property, which is also of considerable importance in selecting a suitable circuit board material, is the facility with which a conductive layer of metal may be bonded to the material. It will be understood that the dielectric materials used in the preparation of circuit boards and high frequency transmission lines must be provided with conductive surface areas. In accordance with one method for manufacturing circuit boards, a sheet of copper foil is first adhered to the surface of the dielectric material. The individual circuits are formed by coating this copper surface with a photoresist material, applying a mask and exposing it to light, and and then selectively dissolving away portions of the copper foil by use of an acid etch. Obviously, if these techniques are to be utilized, it is necessary that methods be provided for adhering the copper foil to the dielectric material.

Until the present time, the selection of suitable dielectric materials for use in the fabrication of circuit boards, high frequency transmission lines, and the like, has been based upon a compromise of the above properties. This is true since no single material has been capable of providing all of the desirable electrical, chemical, and mechanical properties, as well as having the ability to be adhered to copper foil. It has now been discovered that a new synthetic resinous material not only will provide most of these desired electrical, chemical, and mechanical properties, but that it can be bonded to a copper foil with considerable facility.

Accordingly, it is an object of this invention to prepare dielectric materials that are especially adapted for use in the fabrication of circuit boards, high frequency strip transmission lines, and the like.

Another object of this invention is to provide low loss dielectric materials that have high resistance to chemical attack and are mechanically strong over a wide temperature range.

A further object of this invention is to provide methods and means whereby conductive copper foil members can be bonded to the surfaces of sheets of dielectric materials prepared in accordance with this invention.

Briefly, these and other objects are achieved by utilizing materials comprised of polyphenylene oxide to form sheets of dielectric material. The polyphenylene oxide of this invention not only has satisfactory electrical properties, but it is chemically resistant to oxidation and attack by most chemicals, and it maintains its high mechanical strength over a wide temperature range. Surprisingly, it has been discovered that despite the comparative chemical inertness of the polyphenylene oxide, certain relatively simple techiques make it possible to bond a copper foil to the surface of the polyphenylene oxide dielectric sheets. Briefly, these techniques encompass oxidizing a surface of the copper foil to the black coupric oxide state and then placing such surface in contact with the polyphenylene oxide sheet under conditions of elevated temperatures and pressures whereby a strong bond is developed therebetween.

The polyphenylene oxide used in the practice of this invention may be represented by the following structural formula:

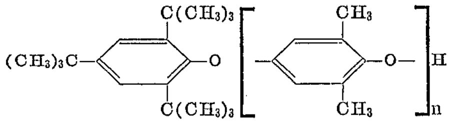

The drawing

The figure is a view in cross section of a portion of a circuit board 1 constructed in accordance with this invention. The circuit board 1 is comprised of a generally flat sheet of dielectric material 3, onto the surfaces of which have been adhered thin sheets of copper foil 2. The dielectric material 3 is comprised of polyphenylene oxide.

Example I

Molding granules prepared from polyphenylene oxide were placed in a heated mold that was 6 inches square and 1 inch deep. The mold was closed without applying pressure to the polyphenylene oxide granules and was then heated to 500° F. for a period of about 18 minutes. After this time, the pressure on the mold was increased to 400 p.s.i. and this pressure was maintained for 20 minutes while at the aforesaid temperature of 500° F. Cooling water was then circulated around the mold and, after the mold had been cooled to room temperature, the pressure was relieved, the mold was opened, and a flat plate of material about ⅛ inch thick was removed from the mold.

This ⅛ inch plate of polyphenylene oxide was then tested for certain properties and the following are representative:

| Property | ASTM test | Average value |
|---|---|---|
| Heat distortion temperature (264 p.s.i.) | D648 | 380° F. |
| Low temperature brittleness point | | −275° F. |
| Coefficient of linear expansion | D696 | 290,000 in./in./° F. |
| Tensile strength (73° F. yield) | D638 | 10,500. |
| Tensile strength (257° F. yield) | D638 | 6,000. |
| Tensile modulus (73° F.) | D638 | 390,000 p.s.i. |
| Tensile modulus (257° F.) | D638 | 350,000 p.s.i. |
| Creep (10,000 hours at 3,000 p.s.i. at 73° F.). | D674 | 1.0%. |
| Flexural modulus (73° F.) | D790 | 380,000. |
| Dielectric strength | D149 | 500 volts/mil. |
| Volume resistivity | D257 | $10^{17}$ ohm-cm. |
| Dielectric constant | D1531 | 2.55. |

Example II

A 6 x 6 inch plate was fabricated in accordance with Example I in order to prepare a circuit board by bonding a layer of copper foil on both sides of the dielectric material. Copper foil of about 3 mils thickness was selected, and after it had been carefully cleaned in concentrated nitric acid, it was oxidized on one side to the black cupric oxide state. The copper foil was then cut into two 6 x 6 inch squares and one of these squares was placed on each side of the dielectric material with the cupric oxide side of the copper foil facing the dielectric material.

This laminate was then placed in a mold heated to 500° F. and was subjected to a pressure of about 400 p.s.i. After a period of about 10 minutes, the supply of heat was discontinued and cooling water was circulated around the mold. About 5 minutes later, the pressure was released, the mold was opened, and the circuit board removed.

The copper-clad polyphenylene oxide dielectric board was examined and it was found that the copper foil was securely bonded on both sides. This experiment was duplicated a number of times, varying the pressure between about 250 to 750 p.s.i. and the temperature between about 400° F. and 600° F., and it was found that the strength of the adhesion of the copper foil to the polyphenylene oxide varied in a range of from about 3 to about 20 lbs./in. This degree of adhesion is quite adequate for most circuit board and high frequency strip transmission line applications.

I claim:

1. A method for the production of a circuit board, high frequency strip transmission line, or the like, comprising the steps of forming a polyphenylene oxide sheet and bonding a copper foil onto at least a portion of the surface of said sheet by oxidizing at least one surface of the copper foil to an oxide state, contacting said sheet with said oxidized surface, and pressing said copper foil against said sheet at elevated temperatures until a satisfactory bond is obtained.

2. A method according to claim 1 in which said temperatures are in a range of from about 400° F. to 600° F. and said pressing is at pressures in a range of from about 250 to 750 p.s.i.

3. A method for the preparation of a circuit board comprised of a base layer of polyphenylene oxide having surface portions covered with an adherent layer of copper foil, comprising the steps of forming a solid sheet of polyphenylene oxide, oxidizing the surface of copper foil to the cupric oxide state, contacting said surface of said polyphenylene oxide sheet with said oxidized surface of said copper foil, and bonding said copper foil to said polyphenylene sheet by the application of heat and pressure.

4. A method according to claim 3 in which said temperature is in the range of from about 400° F. to about 600° F. and said pressures are in the range of from about 250 to 700 p.s.i.

References Cited

UNITED STATES PATENTS

| | | | |
|---|---|---|---|
| 2,551,591 | 5/1951 | Foord | 161—225 |
| 2,676,309 | 4/1954 | Armstrong | 333—84 |
| 2,884,161 | 4/1959 | Hurd et al. | 161—225 X |
| 2,932,599 | 4/1960 | Dahlgren | 161—225 X |
| 2,963,538 | 12/1960 | Dahlgren | 174—68.5 X |
| 2,994,059 | 7/1961 | Dahlgren et al. | 339—188 |
| 3,093,805 | 6/1963 | Osifchin et al. | 333—84 |
| 3,306,875 | 2/1967 | Hay | 260—47 |

OTHER REFERENCES

Chemical Week, P.P.O.: Secret No More, Dec. 12, 1964, pp. 81–82.

HAROLD ANSHER, Primary Examiner

R. A. KILLWORTH, Assistant Examiner

U.S. Cl. X.R.

161—225; 174—68.5, 117